United States Patent [19]

Sakai

[11] Patent Number: 5,734,462
[45] Date of Patent: Mar. 31, 1998

[54] EXPOSURE APPARATUS AND EXPOSURE METHOD

[75] Inventor: Fumio Sakai, Utsunomiya, Japan

[73] Assignee: Canon Kabushiki Kaisha, Tokyo, Japan

[21] Appl. No.: 521,442

[22] Filed: Aug. 30, 1995

[30] Foreign Application Priority Data

Sep. 5, 1994 [JP] Japan .................. 6-234479

[51] Int. Cl.$^6$ ............................... G03B 27/42
[52] U.S. Cl. .................. 355/53; 355/77; 356/401
[58] Field of Search .................. 355/53, 77; 356/400, 356/401; 250/248; 364/489

[56] References Cited

U.S. PATENT DOCUMENTS

| | | | |
|---|---|---|---|
| 4,780,617 | 10/1988 | Umatate et al. | 250/546 |
| 4,881,100 | 11/1989 | Nakai et al. | 355/53 |
| 5,365,051 | 11/1994 | Suzuki et al. | 250/548 |
| 5,561,606 | 10/1996 | Ota et al. | 364/489 |

FOREIGN PATENT DOCUMENTS 0150129  7/1985  European Pat. Off. .

*Primary Examiner*—R. L. Moses
*Attorney, Agent, or Firm*—Fitzpatrick, Cella, Harper & Scinto

[57] ABSTRACT

An alignment method and apparatus is disclosed wherein, in one exposure process, alignment of a semiconductor substrate may be performed and, while moving the semiconductor substrate in a step-and-repeat manner in relation to shot positions on the semiconductor substrate, a pattern of an original may be printed on the semiconductor substrate at the respective shot position, wherein the one exposure process may be performed while using a plurality of placement data each specifying positions with respect to which the semiconductor substrate is to be positioned during the step-and-repeat motion.

10 Claims, 3 Drawing Sheets

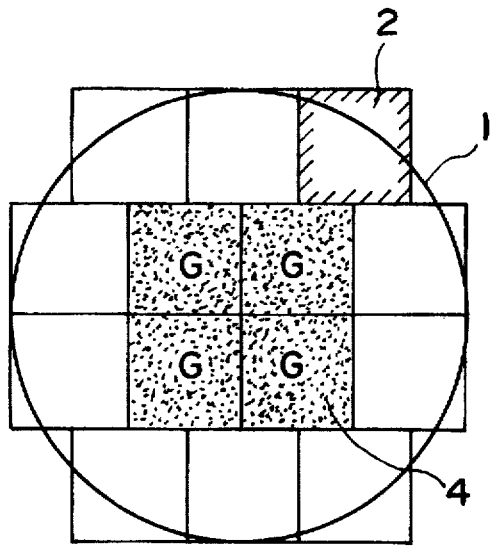
F I G. IA
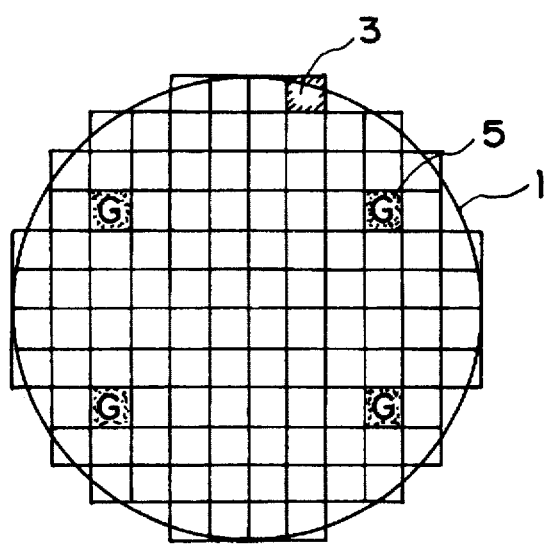
F I G. IB

EXPOSURE APPARATUS AND EXPOSURE METHOD

FIELD OF THE INVENTION AND RELATED ART

This invention relates to a semiconductor exposure apparatus (called "stepper") and an exposure method, capable of performing very high precision exposure.

A wafer to be exposed by a stepper has a layout of shots (shot areas) thereon with respect to each of which the alignment of the wafer is to be done through the step-and-repeat motion. This layout is determined in accordance with the exposure size, to be exposed in that stepper. For example, if the exposure size is 20 mm square, the wafer is formed with a layout of 20 mm pitch, only. Many operations such as alignment operation, focus leveling adjustment or exposure operation are done on the basis of this layout.

SUMMARY OF THE INVENTION

However, with recent enlargement of the exposure size of steppers, the number of step-and-repeat motions (usually corresponding to the number of shots) to be done to a wafer has decreased. If the alignment operation or focus leveling adjustment is made in the layout with a decreased number of shots, problems such as follows arise.

First, currently, the alignment procedure uses an alignment method called global alignment, taking both the productivity of IC or LSI and the alignment precision into account. In this method, from measured values are taken on a few shots (sample shots) of a wafer, positional information about the shot layout of the wafer is detected and, based on this, alignment operation for all the shots of the wafer is executed. However, if the number of shots on a wafer is reduced, selection of sample shots is restricted, causing decrease of alignment precision.

For example, in a case of an 8-inch diameter wafer having a layout with an exposure size of 50 mm square (FIG. 1A), only shots 2 of about 14 can be defined on the wafer 1. In this example, taking into account the possibility that, at wafer outside peripheral shots, a measured value to be used for the alignment contains an error due to distortion of the wafer or to variation in film thickness of a photosensitive material on the wafer 1, it is only possible to select four sample shots 4 about the center of the wafer 1. If global alignment method is to be carried out on the basis of only the four sample shots about the center of the wafer 1, the span of sample shots to be measured in the vicinity of the center of the wafer 1 is very short and the number of sample shots is very small (only 4). The precision of measurement to rotation or magnification of the shot layout within the wafer 1 will be degraded. Setting a larger interval (span) between sample shots and using a larger number of sample shots, effectively reduces errors in the measured value.

Second, as for focus leveling adjustment, there are two methods: a global leveling method wherein leveling of a wafer 1 as a whole is performed on the basis of a few sample shots but the focusing is adjusted in every shot; and a die-by-die leveling method wherein both the leveling and the focusing are adjusted in every shot. In the leveling operation according to the global leveling method, shortness in the span of sample shots and smallness in the number of sample shots causes degradation of a measured value, as in the alignment operation. In the die-by-die leveling method, there is a choice that, when outside peripheral shots of a wafer 1 include one with respect to which the measurement for focus leveling is not attainable, the focus leveling of that shot is performed by using the information of the focus leveling value related to the preceding shot. In this case, however, if the layout has only a small number of shots, the "preceding" shot is too remote. Thus, there occurs a large error in prediction of the "current" shot.

It is an object of the present invention to provide an exposure apparatus and/or an exposure method which enables correct global alignment and/or focus leveling regardless of a large exposure size.

In accordance with an aspect of the present invention, in one exposure process, alignment of a semiconductor substrate may be performed and, while moving the semiconductor substrate in a step-and-repeat manner in relation to shot positions on the semiconductor substrate, a pattern of an original may be printed on the semiconductor substrate at the respective shot position, wherein the one exposure process may be performed while using a plurality of placement data each specifying positions with respect to which the semiconductor substrate is to be positioned during the step-and-repeat motion.

The placement data may include data to be used for the step-and-repeat motion related to the exposure process and at least one of data to be used for measurement related to global alignment of the semiconductor substrate and data to be used for measurement related to focus leveling of the semiconductor substrate, and wherein the exposure process may be performed while correcting alignment data or focus leveling data as measured in accordance with placement data related to the global alignment or placement data related to the focus leveling, into placement data for the step-and-repeat motion related to the exposure process.

As for placement data for the measurement related to global alignment of the semiconductor substrate or as for placement data for the measurement related to focus leveling of the semiconductor substrate, data which enables correct measurement related to alignment or focus leveling may be prepared. The measurement related to the global alignment or focus leveling may be performed on the basis of the thus prepared placement data. Measured values may be corrected into data related to global alignment or focus leveling. Thus, even if the number of shots in exposure process is small, correct alignment or focus leveling is assured.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B are plan views, respectively, showing examples of layout of shots to be exposed by a stepper in accordance with an embodiment of the present invention.

DESCRIPTION OF THE PREFERRED EMBODIMENTS

Before describing details of the present invention, a projection exposure apparatus of a step-and-repeat type or a step-and-scan type, called a stepper, will be explained in conjunction with FIG. 3.

Figure 3:
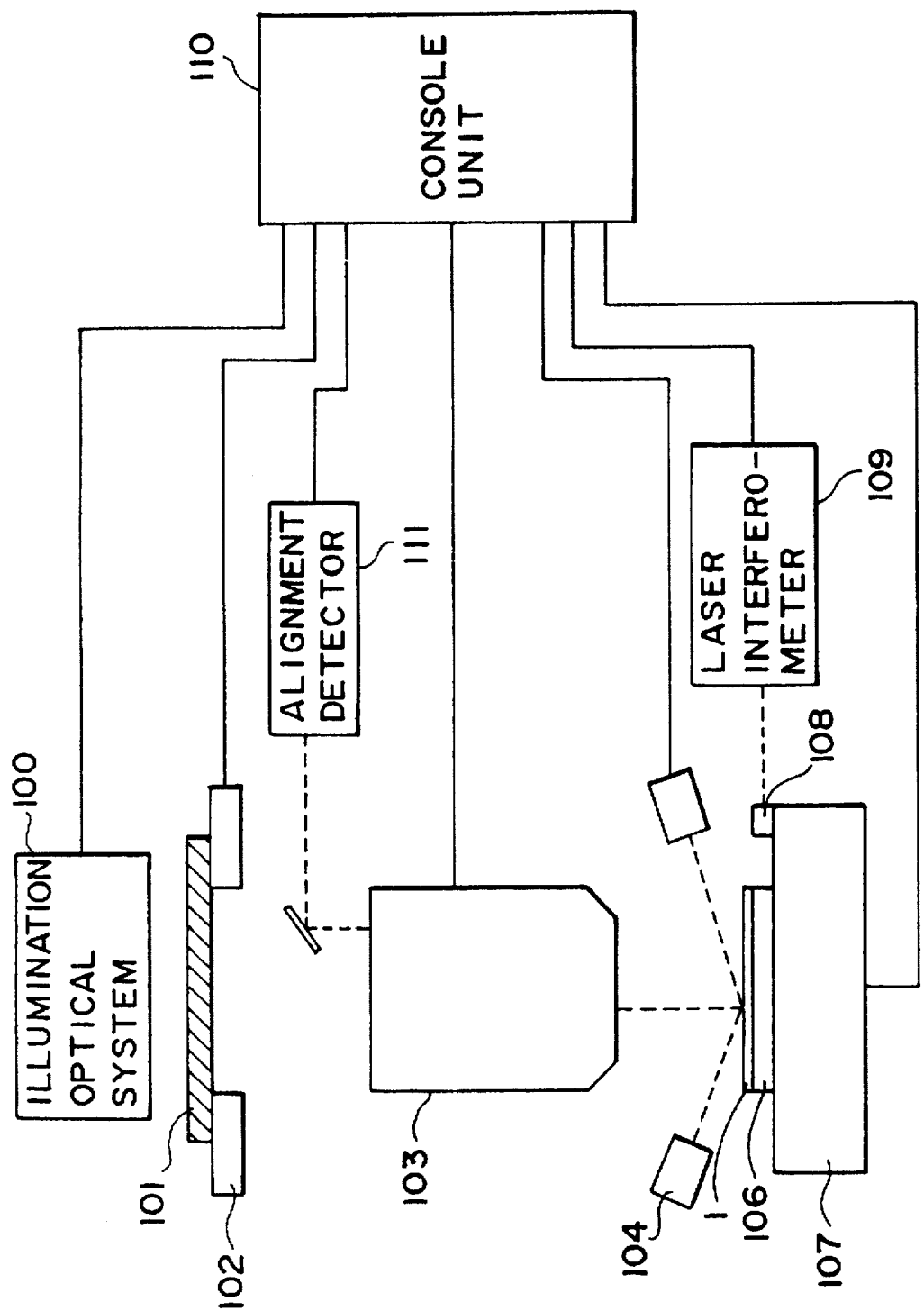
FIG. 3 is a schematic view of a projection exposure apparatus for manufacture of semiconductor devices, to which the present invention is applied.

In FIG. 3, denoted at 100 is an illumination optical system for producing exposure light with which a pattern (having plural chip patterns) formed on a reticle 101 is projected and printed on a photosensitive resist layer, provided on a wafer 1. Denoted at 102 is a reticle stage for holding the reticle 101. In response to projection of exposure light from the illumination optical system 100 upon the reticle 101 held by the reticle stage 102, the pattern of the reticle 101 is projected by a reduction projection lens 103 on the wafer which is held by a wafer chuck 106, in a reduced scale.

Denoted at 104 is an autofocus detector of known type. It projects a light beam onto the surface of the wafer 1 and, by detecting reflected light therefrom, it detects the position of the wafer surface in the direction of an optical axis (Z axis direction), with respect to the focusing plane of the projection optical system. On the basis of the result of this detection, the wafer chuck 106 is moved by a driving mechanism (not shown) in the optical axis direction of the projection lens 103, so as to place the wafer 1 surface on the focusing plane of the projection lens 103.

Denoted at 107 is a wafer stage for moving the wafer 1, held by the wafer chuck 106, along a plane (X-Y plane) perpendicular to the optical axis of the projection lens 103. This stage performs step-and-repeat motion for sequential exposures of zones on the wafer 1.

Denoted at 108 is a mirror which is movable integrally with the wafer stage 107 and along the X-Y plane. Denoted at 109 is a known laser interferometer type measuring device for measuring a position along the X-Y plane, and denoted at 110 is a console unit for controlling the projection exposure apparatus as a whole. Denoted at 111 is a known alignment detector for detecting an alignment mark, provided on the wafer 1, through the projection lens 103 to detect the position of the wafer 1 along the X-Y plane. The console unit 110 controls the projection exposure apparatus as a whole, and on the other hand it serves to determine and select shot layout, to be described later. Operational steps to be described below are executed in a CPU of the console unit 110, except mentioned otherwise.

FIGS. 1A and 1B are plan views showing examples of layout of shots to be exposed by a stepper according to an embodiment of the present invention. FIG. 1A shows an exposure layout to be used in a stepper of large exposure field size in a single exposure (large picture size stepper), and FIG. 1B shows an exposure layout to be used in a stepper of small exposure field size in a single exposure (small picture size stepper) or a layout of IC or LSI chips of a number 11. Denoted in these drawings at 1 is a wafer, and denoted at 2 are shots to be used in the large exposure field size stepper. Denoted at 4 are sample shots for alignment or global leveling, to be used in the large picture size stepper. Denoted at 3 are shots or IC or LSI chips to be used in the small picture size stepper. Denoted at 5 are sample shots for alignment or global leveling, to be used in the small picture size stepper or in the layout of IC or LSI chips.

FIG. 1A relates to an example of layout in a large picture size stepper. If in this example the exposure size is 50 mm square and the wafer 1 has an 8 inch diameter, then shots of a number 14 are defined such as shown in FIG. 1A. For selection of sample shots for global alignment, global leveling and die-by-die leveling, with this layout there is a possibility that a measured value related to an outside peripheral shot of the wafer contains an error due to a large variation in film thickness of a photosensitive material on the wafer or to a large distortion of the wafer 1. Excluding such outside peripheral shots of the wafer from selection of sample shots for this reason, only four sample shots 4 at the central portion of the wafer 1 are selectable as shown in FIG. 1A. Since the interval (span) of these four sample shots 4 is very small as compared with the size of the wafer 1, if the global alignment or global leveling is executed on the basis of these sample shots 4 and the placement or tilt of all shots on the wafer 1 is determined, a large error will occur.

Here, considering a layout to be used in a small picture size stepper or a layout of a series of chips such as shown in FIG. 1B, even when outside peripheral shots of a wafer are excluded as described, tens of shots can be selected as the sample shots 5. Also, the span of sample shots defined as a result of this sample shot selection is not very small as compared with the size of the wafer 1. This is effective to reduce an error in the determination of placement or tilt.

In an occasion where a large picture size stepper and a small picture size stepper are used alternately in manufacture of ICs or LSIs, even in the small picture size stepper similar procedures (e.g. global alignment) as in the large picture size stepper are performed. Thus, each shot 3 of the layout for the small picture size stepper shown in FIG. 1B is provided with a mark (not shown) to be used for the global alignment operation, for example. Using these marks also in the large picture size stepper substantially makes it possible to select the sample shots 5 in the layout to be used in the small picture size stepper. This can be easily done by setting the same magnification or detecting process to the mark detecting system 111 (FIG. 3).

Substantially the same advantageous result is attainable by preparing a separate layout of marks (coordinates of marks on a wafer) for global alignment, for example, in relation to the large picture size stepper. In that occasion, the advantageous result is retained even if the stepper is not used alternately with the small picture size stepper.

A layout for a small picture size stepper or a layout of chips such as shown in FIG. 1B, or alternatively a layout of mark placement on a wafer prepared separately may be used for the measurement in relation to global alignment, global leveling or die-by-die leveling, for example. The results of measurement may be corrected for the exposure layout of FIG. 1A, and the exposure process may be performed by using corrected values and in accordance with the exposure layout. This enables high precision alignment and focus leveling even in a large picture size stepper.

Figure 2:
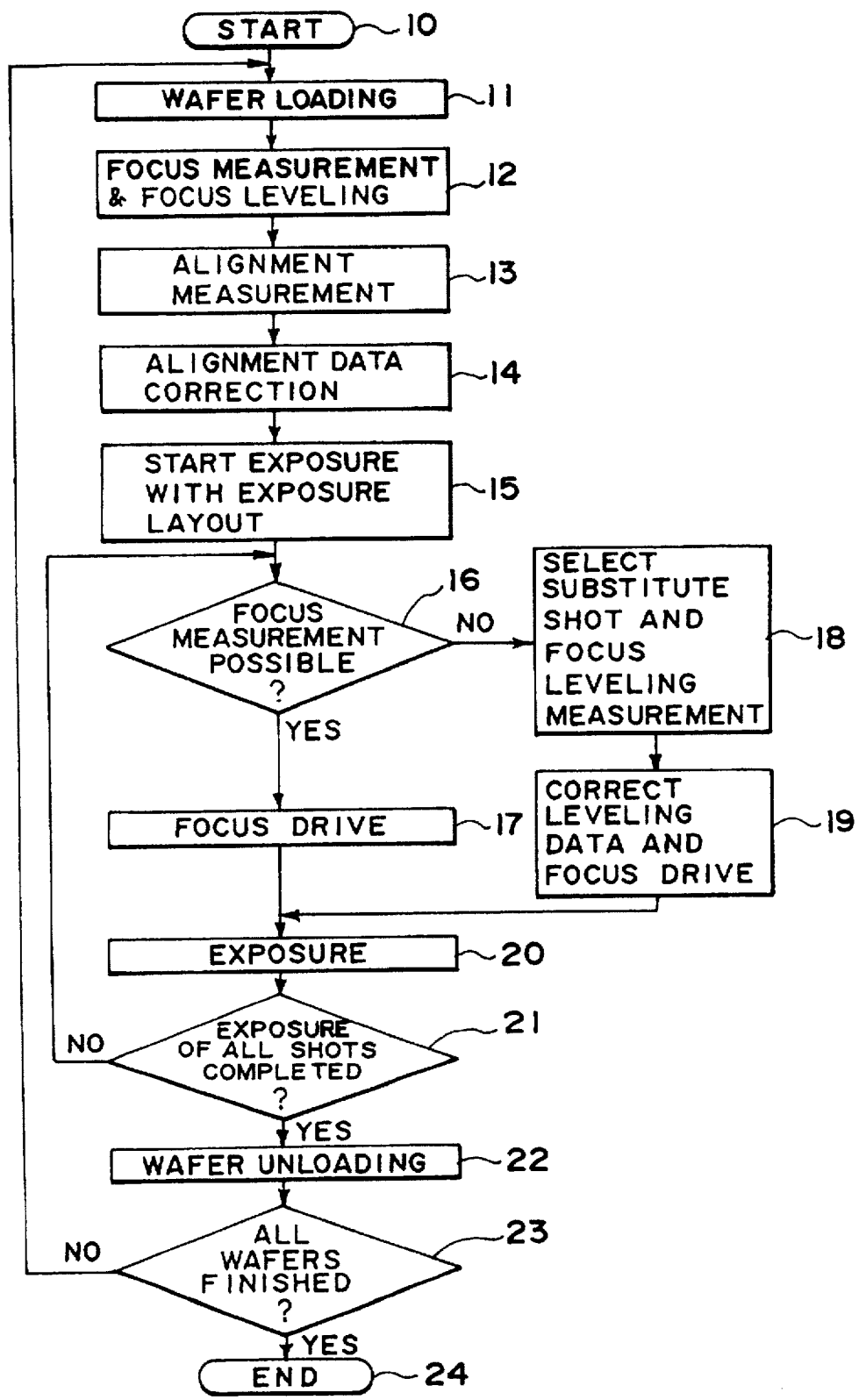
FIG. 2 is a flow chart for explaining the operation where the layout such as shown in FIG. 1A or 1B is used.

FIG. 2 is a flow chart for explaining this procedure. In a stepper, after setting a reticle to be used and setting exposure conditions such as focus, exposure amount and layout preparation, an actual exposure sequence starts (Step 10). A wafer is loaded and prealignment of the wafer is performed, and thereafter it is placed on the wafer chuck 106 (FIG. 3) of the stepper (Step 11). Then, for measurement of global leveling component of the wafer 1 placed on the chuck 106 and for the leveling of the same, measurement positions (i.e. sample shots 5) are determined in accordance with the focus leveling layout (e.g. shot layout of FIG. 1B). On the basis of the determination and by using the autofocus detector 104 (FIG. 3), data measurement for the focus leveling is performed. In accordance with the measured data, the leveling is executed (Step 12). Subsequently, for execution of global alignment, measurement positions (sample shots 5) are determined in accordance with the alignment layout (e.g. shot layout of FIG. 1B). On the basis of the determination and by using the alignment detection system 111, data measurement for execution of global alignment is performed (Step 13). Then, calculations in relation to the shot interval and the number of shots, for example, are made to transform the measured data into exposure layout (e.g. shot layout of FIG. 1A), and the placement of shots in the exposure layout is determined (Step 14). Namely, alignment data is corrected into exposure layout data. Then, exposure process is performed in accordance with the thus determined placements (Step 15).

Subsequently, discrimination is made as to whether data measurement for focus and leveling to a shot to be exposed is possible or not, that is, as to whether that shot is an outside peripheral shot to which measurement is unattainable or not (Step 16). If measurement is possible, drive for focus and leveling is done in accordance with a measured value (Step 17), and exposure of that shot is performed (Step 20). If that shot is one for which measurement is unattainable, the focus leveling layout is referred to and a substitute shot in the focus leveling layout adjacent to that shot is selected. Measurement for focus and leveling is done with respect to the selected substitute shot (Step 18). In accordance with the thus measured data, a value for the focus and leveling to the shot just going to be exposed with the exposure layout, is determined. For example, a focus value may be determined by extrapolation to the leveling data in accordance with tilt of it. The leveling value may be used as it is. On the basis of the thus detected value, drive for focus leveling is done (Step 19). Then, exposure process is performed (Step 20).

The sequential operations at Steps 16–20 are repeated with respect to every shot of the wafer. After this is completed, the wafer is unloaded (Step 22). Also, the sequential operations at Steps 11–22 are repeated to every wafer, and the procedure is completed (Step 24).

In the flow chart described above, many modifications are possible. As an example, the operations at Steps 11 and 12 may be inserted between Steps 14 and 15. The present invention is not limited to the form depicted in this flow chart.

In the present invention, as described, a separate layout or layouts other than an exposure layout may be prepared as required (for example, an exposure layout, an alignment layout and a focus leveling layout may be prepared). These different layouts may be used in the effective exposure of a wafer.

In the embodiment of the present invention described above, the alignment layout and the focus leveling layout are the same. However, they may be different from each other.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:
   a substrate stage for holding a substrate having a number of shot areas defined thereon by use of a first exposure region of a smaller frame size and first layout data for the smaller frame size, each shot area having an alignment mark;
   alignment detecting means for detecting alignment marks of shot areas of the substrate in accordance with a predetermined sequence;
   exposure means having a second exposure region of a larger frame size corresponding to a size of plural shot areas of the substrate; and
   control means being operable, when alignment marks of shot areas of the substrate are to be detected sequentially by use of said alignment detecting means, to control motion of said substrate stage in accordance with the first layout data for the smaller frame size and being operable, when a plurality of sets of shot areas of the substrate are to be exposed in a predetermined sequence, to control motion of said substrate stage in accordance with second layout data for the larger frame size corresponding to the second exposure region of said exposure means.

2. An apparatus according to claim 1 wherein, when said control means controls motion of said substrate stage in accordance with the first layout data for the smaller frame size, said control means transforms alignment data, obtained through said alignment detecting means, into corrected alignment data corresponding to the second layout data for the larger frame size.

3. An apparatus according to claim 2 wherein, when the sets of shot areas of the substrate are exposed by use of said exposure means in sequence, said control means control motion of said substrate stage in accordance with the second layout data for the larger frame size corresponding to the second exposure region or said exposure means and with the corrected alignment data.

4. An apparatus according to claim 1, further comprising leveling means for measuring leveling of the substrate, wherein said control means controls motion of said substrate stage for the leveling measurement through said leveling means, in accordance with the first layout data for the smaller frame size.

5. An apparatus according to claim 1, further comprising leveling means for measuring leveling of the substrate, wherein said control means controls motion of said substrate stage for the leveling measurement through said leveling means, in accordance with third layout data different from the first layout data for the smaller frame size.

6. An exposure method, comprising the steps of:
   holding a substrate through a substrate stage, the substrate having a number of shot areas defined thereon by use of a first exposure region of a smaller frame size and first layout data for the smaller frame size, each shot area having an alignment mark;
   detecting alignment marks of shot areas of the substrate by use of alignment detecting means, in accordance with a predetermined sequence, while controlling motion of the substrate stage in accordance with the first layout data for the smaller frame size; and
   exposing a plurality of sets of shot areas of the substrate in a predetermined sequence by use of exposure means having a second exposure region of a larger frame size corresponding to a size of plural shot areas of the substrate, while controlling motion of the substrate stage in accordance with second layout data for the larger frame size corresponding to the second exposure region of the exposure means.

7. A method according to claim 6 wherein, when motion of the substrate stage is controlled in accordance with the first layout data for the smaller frame size, alignment data obtained through the alignment detecting means is transformed into corrected alignment data corresponding to the second layout data for the larger frame size.

8. A method according to claim 7 wherein, when the sets of shot areas of the substrate are exposed by use of the exposure means in sequence, motion of the substrate stage is controlled in accordance with the second layout data for the larger frame size corresponding to the second exposure region of the exposure means and with the corrected alignment data.

9. A method according to claim 6, further comprising measuring leveling of the substrate while controlling motion of the substrate stage for the leveling measurement in accordance with the first layout data for the smaller frame size.

10. A method according to claim 6, further comprising measuring leveling of the substrate while controlling motion of the substrate stage for the leveling measurement in accordance with third layout data different from the first layout data for the smaller frame size.

* * * * *